(12) United States Patent
Miyazaki et al.

(10) Patent No.: US 7,705,324 B2
(45) Date of Patent: Apr. 27, 2010

(54) SAMPLE HOLDER

(75) Inventors: Hiroya Miyazaki, c/o Sakano & Associates, #707, Nostel Court Kannai, 2-43 Aioi-cho, Naka-ku, Yokohama-shi, Kanagawa-ken (JP) 231-0012; Satoshi Hata, Kasuga (JP)

(73) Assignee: Hiroya Miyazaki, Umi-machi (JP)

( * ) Notice: Subject to any disclaimer, the term of this patent is extended or adjusted under 35 U.S.C. 154(b) by 828 days.

(21) Appl. No.: 11/522,637

(22) Filed: Sep. 18, 2006

(65) Prior Publication Data

US 2007/0063148 A1 Mar. 22, 2007

(30) Foreign Application Priority Data

Sep. 20, 2005 (JP) ............................. 2005-306363

(51) Int. Cl.
*H01J 37/20* (2006.01)
(52) U.S. Cl. ............................. 250/442.11; 250/440.11; 250/311

(58) Field of Classification Search ............ 250/442.11, 250/440.11, 311
See application file for complete search history.

(56) References Cited

U.S. PATENT DOCUMENTS 5,264,705 A * 11/1993 Honda et al. ........... 250/442.11
5,591,980 A * 1/1997 Ogasawara et al. .... 250/442.11

FOREIGN PATENT DOCUMENTS

JP    A-2001-15056    1/2001

* cited by examiner

*Primary Examiner*—Kiet T Nguyen
(74) *Attorney, Agent, or Firm*—AdvantEdge Law Group, LLC

(57) ABSTRACT

A sample holder according to the present invention is characterized in that the sample holder comprise a holder body, a sample retaining stage, a means capable for tilting the sample around an axis which is arranged in a direction perpendicular to a long side of the holder body, wherein the means has a mechanism capable for tilting the sample around the axis with no relation to the existence of a fulcrum retaining member at the said axis.

12 Claims, 4 Drawing Sheets

SAMPLE HOLDER

BACKGROUND OF THE INVENTION

1. Field of the Invention

The present invention relates to a sample holder. In particular, the invention relates to a sample holder which has a means capable for tilting a sample around an axis with no relation to the existence of a fulcrum retaining member at the tilt axis.

2. Related Art Statement

FIG. 1 shows a diagrammatic illustration of a sample holder which has a means for tilting the sample with axes parallel (hereinafter called α tilt) and perpendicular (hereinafter called β tilt) to a long side of the holder body. Such a sample holder is typically used for electron microscopes such as a transmission electron microscope (TEM), a scanning transmission electron microscope (STEM) or the like.

There have been sample holders which comprise a holder body, a sample retaining stage and a sample retaining member. For example, a tilted sample stage has been invented since the tilt angle for the sample is notably restricted in the electron microscopes (JP-A 2001-15056, this is hereinafter called the patent reference 1).

However, in the prior art that essentially needs a fulcrum retaining member as shown in FIG. 1, there is the following problem: it is difficult to ensure a large α tilt angle because of interference between the fulcrum retaining member 15 for the β tilt stage 16 and upper 13 and lower 14 objective lens pole pieces (hereinafter called P-Ps) with a restricted spatial gap.

In other words, when the electron microscope observation is performed using a sample holder equipped with a double-tilt (α- and β-tilt) mechanism and a sample 17 supported at an apical portion of the sample holder is subsequently inserted and α-tilted at a cross-over point of the optical axis 10 and the focal plane 11 located between the upper 13 and lower 14 P-Ps, a large α tilt angle is not ensured since the fulcrum retaining member 15 interferes with the upper 13 and lower 14 P-Ps.

Further, in characteristic X-ray measurements, because the fulcrum retaining member 15 is a barrier to an emission pathway of characteristic X-rays, α tilt is needed in order to avoid the barrier. Namely, both the α- and β-tilt functions are required depending on the shape and crystallographic orientation of the sample in the characteristic X-ray measurements, and an X-ray detector is set between the upper P-P 13 and the focal plane 11 in order to detect X-rays emitted from the sample to the detector direction 12. As a result, the fulcrum retaining member for the β tilt 15 becomes a barrier to the emission pathway of the characteristic X-rays, and additional α tilt is needed for avoiding the barrier.

Furthermore, it is impossible to remove the sample stage 16 and exchange it with another sample stage, because the sample stage 16 capable for the β tilt is incorporated into the fulcrum retaining member 15. In the characteristic X-ray measurements, characteristic X-rays are generated from the sample stage as background since the electron beam in the electron microscope actually illuminates the sample stage as well as the sample. The influence of the background X-rays from the sample stage can be quantitatively measured by changing the material for the sample stage. However, it is actually necessary to prepare a number of sample holders with the sample stage 16 made of different materials, since the sample stage 16 has been incorporated into the member 15 for the β tilt.

The same problem described above exists in the patent reference 1. In the patent reference 1, there is a tilted sample stage to compensate the α tilt. However, a fulcrum retaining member such as the member 15 is still needed in order to add a β-tilt function. This means that nothing can hold and tilt the sample stage without the fulcrum retaining member; otherwise the stage is floating in the air.

In addition, there is another problem: although such a fulcrum retaining member as described above must be generally needed for ensuring mechanical strength of the holder itself, the member becomes a barrier to the movement of α tilt. Therefore, an art for attaining the β-tilt function without using a fulcrum retaining member is being desired. However, such a technique is unknown up to now.

SUMMARY OF THE INVENTION

Therefore, in order to resolve the above problems, it is an object of the present invention to provide a sample holder in which the tilting mechanism with the β axis arranged in a direction perpendicular to a long side of the holder body is greatly improved.

In order to accomplish the above objects, the present inventors made strenuous studies on the structure of the sample holder. As a result, the inventors discovered the present invention.

The sample holder according to the present invention is characterized in that the sample holder comprises a holder body, a sample retaining stage, a means capable for tilting the sample with the β axis, wherein the means has a mechanism capable for tilting the sample around the β axis with no relation to the existence of a fulcrum retaining member at the β axis.

In a preferred embodiment of the sample holder according to the present invention, the invention is characterized in that the means may tilt the sample around the β axis under the condition that a position of the β axis is maintained in the focal plane.

Further, in a preferred embodiment of the sample holder according to the present invention, the invention is characterized in that the sample stage may be removable from the holder body.

Further, in a preferred embodiment of the sample holder according to the present invention, the invention is characterized in that the means has a driving frame for tilting the sample around the β axis.

Further, in a preferred embodiment of the sample holder according to the present invention, the invention is characterized in that the driving frame is attached to the sample stage.

Further, in a preferred embodiment of the sample holder according to the present invention, the invention is characterized in that the driving frame has at least one fulcrum capable for making rotation as an axis and a fulcrum capable for moving itself within the driving frame.

Further, in a preferred embodiment of the sample holder according to the present invention, the invention is characterized in that the means capable for the β tilt has a link member attached to the driving frame.

Further, in a preferred embodiment of the sample holder according to the present invention, the invention is characterized in that the link member has a fulcrum fixed to the holder body, and is attached to the driving frame through a fulcrum of the driving frame.

Further, in a preferred embodiment of the sample holder according to the present invention, the invention is characterized in that there is one or more of the link member.

Further, in a preferred embodiment of the sample holder according to the present invention, the invention is characterized in that the link member has a fulcrum on the holder axis parallel to the long side of the holder body (hereinafter called α axis).

Further, in a preferred embodiment of the sample holder according to the present invention, the invention is characterized in that the sample stage may tilt with a desired β axis located at a virtual fulcrum on the α axis.

Further, in a preferred embodiment of the sample holder according to the present invention, the invention is characterized in that the holder body has a means capable for tilting the sample around the α axis.

Further, in a preferred embodiment of the sample holder according to the present invention, the invention is characterized in that a means capable for tilting the sample around the β axis under the condition that a position of the β axis is maintained in the focal plane without use of the member for holding a fulcrum at the β axis.

Further, in a preferred embodiment of the sample holder according to the present invention, the invention is characterized in that a barrier caused by the existence of a member for holding a fulcrum at the β axis is removed from an emission pathway of characteristic X-rays between a sample arranged on the optical axis of the electron beam and an X-ray detector attached to the electron microscope.

Further, in a preferred embodiment of the sample holder according to the present invention, the invention is characterized in that the sample holder has a structure capable for easily mounting and removing only the sample stage because of no use of the member for holding a fulcrum at the β axis.

As an example, the present invention may attain a large α tilt angle of the sample holder. FIG. 3 shows that a member 25 of the sample holder is tilted in the electron microscope by driving a power point 32 of a member 22 in a rotation direction 34, where the β tilt axis 33 maintains its height at that of the α tilt axis 38. Since the fulcrum retaining member 15 is not needed, as shown in FIG. 2, it is possible to use effectively the spatial gap between P-P 13 and P-P 14. Therefore, the present invention may attain a large α tilt angle of the sample holder.

As shown further in FIG. 4, for example, by dividing the sample retaining stage member 25 to an arm member for driving and tilting the sample designated by 35 and a sample retaining stage member 36, only the sample retaining stage member 36 can be exchanged with other ones made of desired materials or shapes.

EFFECT OF INVENTION

The sample holder of the present invention has an advantage of producing a sample holder capable for a large α tilt angle because of no use of the fulcrum retaining member at the β axis, as shown in FIG. 2.

Further, the sample holder of the present invention has an advantage of producing a sample holder wherein a barrier of emission pathways of characteristic X-rays is reduced in characteristic X-ray measurements because of the no use of the fulcrum retaining member and or the like, as shown in FIG. 2.

Further, the sample holder of the present invention has an advantage of producing a sample holder capable for exchanging only the sample stage because of the no use of the fulcrum retaining member and or the like, as shown in FIG. 2. Therefore, the sample stage attached to the holder may be rotated on a plane perpendicular to the optical axis.

BRIEF DESCRIPTION OF THE DRAWINGS

For a better understanding of the invention, reference is made to the attached drawings, wherein.

Figure 1:
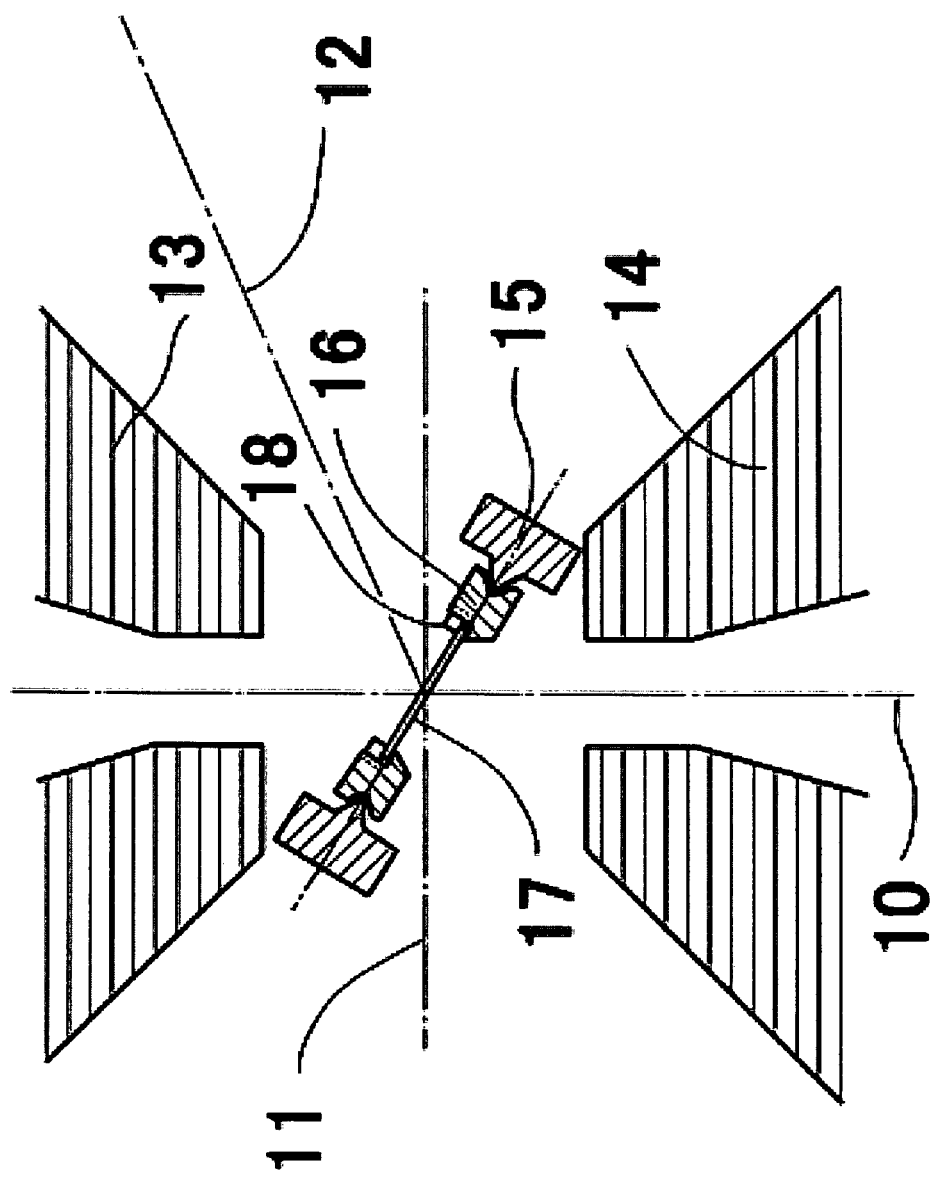
FIG. 1 shows a cross section of the electron microscope and the sample stage viewed from a direction of the α axis of the sample holder, as an example of the structure for the prior art.
Figure 2:
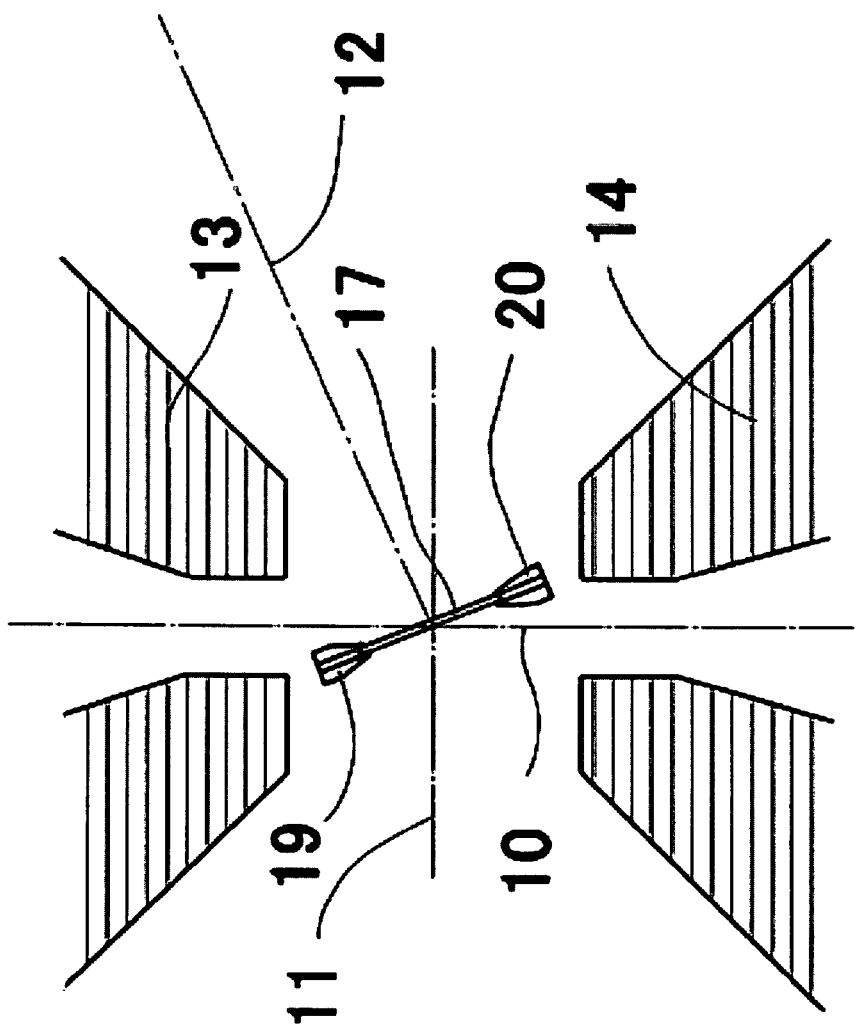
FIG. 2 shows a cross section of the electron microscope and the sample stage viewed from a direction of the α axis of the sample holder, as an example of the structure for the present invention.

Explanation of Symbols 10 an optical axis of the electron beam in the electron microscope
11 the focal plane containing the α axis of the sample holder
12 the direction to the X-ray detector
13 an upper objective lens pole piece (P-P) for the electron beam
14 a lower objective lens pole piece (P-P) for the electron beam
15 a fulcrum retaining member for β tilt (prior art)
16 a sample stage capable for β tilt (prior art)
17 a sample
18 a sample retaining member (prior art)
19 a sample stage capable for β tilt
20 a sample retaining member
21 a frame member (a member mounted to the end of a sample holder main body 21a)
21a a sample holder main body
22 a link member 1
23 a link member 2
24 a link member 3
25 a link member 4 (a frame arm with the sample stage capable for β tilt
26 a fixing pin 1
27 a fixing pin 2
28 a moving pin 1
29 a moving pin 2
30 a imposing pin 1
31 a moving pin 3
32 a driving power point
33 a position of an axis for β tilt
34 movement of the driving power point 32
35 a driving frame arm for β tilt
36 a sample stage
37 a screw for coupling and fixing the sample stage 36 and the driving frame arm for β tilt 35
38 an axis for α tilt
39 a stick-shaped member for inputting the driving power for β tilt (a member for jacking up the driving power point 32)
40 a spring (a member for pushing down the driving power point 32)

DETAILED DESCRIPTION OF THE INVENTION

First of all, an availability of the means for tilting the sample according to the present invention is explained as follows. In prior art, the existence of the fulcrum retaining member for the β tilt is a barrier even if the member is small in size. For a solid angle (called collection angle) between the sample and a window area of the X-ray detector (generally 15-33 mm$^2$), the existence of the member having thickness generally 1.5-2.5 mm in the pole piece gap about 4-5 mm becomes a barrier to the solid angle for detecting X-rays. Therefore, in order to avoid the barrier, α tilt of the sample holder toward the X-ray detector is effective.

The detailed explanation about this matter is as follows. Namely, when the electron beam is irradiated to the sample, characteristic X-rays are generated and scattered to arbitrary directions from the irradiated sample. The distribution of the scattered X-rays is inhomogeneous, depending on the scattering angle. Since the electron beam is irradiated from the upper side of the sample, the X-ray intensity is the smallest in perpendicular directions to the incident electron beam and the highest in the parallel direction to the beam. In the case of a crystalline sample, the X-ray intensity also depends on the crystallographic orientation of the sample in the electron microscope. In the electron microscope, the sample must be loaded into a narrow gap between the upper and lower objective lens pole pieces, and X-rays emitted from the sample must be acquired through the narrow pole piece gap. However, there is a problem that an optical resolution power is reduced if the pole piece gap is widened. In other words, the narrower the pole piece gap is, the higher the optical resolution power becomes. In the case of an electron microscope dedicated for high-resolution imaging, the pole piece gap is generally 2-3 mm. For a conventional electron microscope widely used for materials science, on the other hand, the pole piece gap is generally 3-5 mm. Although there are other electron microscopes having a wide pole piece gap about 5-8 mm, they are generally used for life science and hardly used for materials science because of the shortage of the resolution power. Therefore, a typical pole piece gap for materials characterization is 4-5 mm. Accordingly, it is impossible to put the X-ray detector with 8-15 mm diameter close to the optical axis in the pole piece. A typical distance between the optical axis and the X-ray detector is 13-20 mm, resulting into a notable reduction of the X-ray collection angle.

Therefore, in light of the above geometrical limitations caused by the objective lens pole piece, the X-ray detector is arranged to a horizontal position of the sample or a position closed to the upper pole piece and slightly departing from the optical axis, so that the solid angle for the X-ray detector can be increased to some extent. As a compromise, the angle between the sample surface (at 0° tilt) and a line to the center of the X-ray detector (called take-off angle) is usually 15-20 degrees.

In light of the above reasons, the existence of the fulcrum retaining member having a thickness (generally 1.5-2 mm) becomes a barrier to the solid angle for the X-ray detection, and therefore, in order to avoid the barrier, it is recognized that α tilt of the sample holder toward the X-ray detector is effective.

Although a longer acquisition time may compensate the low detection efficiency of X-rays, the sample is damaged by the electron beam, and furthermore, contamination of the sample occurs, so that different elements (such as carbon) other than the original elements in the sample would be detected. Therefore, it is necessary to detect the sample measure X-rays efficiently for a short acquisition time. Moreover, when a two-dimensional elemental mapping (element distribution) in the sample is obtained by the characteristic X-ray measurements, it takes tremendous time even if the acquisition time for every measuring point is not so long. For example, in the case of a square area consisting of 100× 100=10000 measuring points, it takes 10000 seconds even if the acquisition time is 1 second per point. Therefore, it is recognized that an idea for acquiring X-rays as much as possible is a very important technology.

The sample holder according to the present invention has a holder body, a sample retaining stage, a means capable for tilting the sample around β axis which is arranged in a direction perpendicular to a long side of the holder body, wherein the means has a mechanism capable for tilting the sample around the β axis with no relation to the existence of a fulcrum retaining member at the β axis. The sample holder may have a means for cooling the sample, or a means for heating the sample, or a means for pulling the sample, or combinations of these means, or the like. These derivatives are included in the scope of the sample holder according to the invention, and the invention is not intended to be limited to a specific sample holder.

The material of the holder body is not limited to any specific one, as long as the mechanical strength of the holder itself can be ensured. Since the sample retaining stage is for holding the sample, the sample may be fixed by a sample holding member. In this case with this, the sample may be retained by being wedged between the sample retaining stage and the sample holding member. Furthermore, the sample retaining stage is not limited to any specific one concerning its material and shape as long as it can retain the sample. For example, a various sort of the shape such as a polygon including a rectangle, a regular tetragon, a circular form, etc. may be utilized. In a preferred embodiment, the sample stage may be removable from the holder body. In prior art, on the other hand, it is difficult to exchange only the sample retaining stage with other ones since both the sample retaining stage and the fulcrum retaining member are designed as a set.

According to the means capable for tilting the sample with the β axis arranged in a direction perpendicular to a long side of the holder body, it is possible to tilt the sample with no relation to the existence of a fulcrum retaining member at the β axis. Namely, the fulcrum retaining member in order to hold the β tilt axis is not needed in the present invention. In doing so, when the sample is tilted around α axis parallel to a long side of the holder body, the present invention tremendously increases the maximum α tilt angle because there is no sample retaining member which becomes a barrier to the α tilt in the objective lens P-Ps.

Moreover, the means for tilting the sample makes it possible to tilt the sample under the condition that a position of the β tilt axis is maintained in the focal plane. The β tilt under the condition described above makes it possible to make the electron microscopy and microanalysis correct and continuous in operation, because if the sample retaining stage is drifted to the direction of the α axis by changing the β tilt angle, the stage-drift can be easily compensated by moving the sample holder to the opposite direction.

In a preferred embodiment, the means has a driving frame for rotating the sample around the desired β axis. Further, in a preferred embodiment, the invention is characterized in that the driving frame is attached to the sample retaining stage.

For example, it is possible to tilt the sample around the β axis by using the driving frame having at least one fulcrum capable for rotation as an axis and a fulcrum capable for moving itself within the driving frame. Further, in a preferred embodiment, the means for the β tilt may have a link member attached to the driving frame. For example, in the case that a back-and-forth motion of a member within the holder body is finally converted to the β-tilting motion, the transmission of motion can be executed through the link member. The backand-forth motion may be converted to the β-tilting motion by using the link member which has a fulcrum fixed to the holder body and is attached to the driving frame through a fulcrum of the driving frame. The link member is not limited to any specific one, but including one or more of the link member. Moreover, the link member may have a fulcrum on the α axis.

In this way, it is possible to tilt the sample retaining stage around the β axis which has a virtual fulcrum on the α axis.

Further, in a preferred embodiment of the sample holder according to the present invention, the holder body has a means capable for tilting the sample around the α axis. This is because when characteristic X-ray measurements or three-dimensional (3D) observations are performed for the sample set on the optical axis in the electron microscope, the sample holder should be able to be tilted around both the α and β axis, especially for a crystalline sample.

Further, in a preferred embodiment of the sample holder according to the present invention, the invention is characterized in that a means capable for tilting the sample around axis under the condition that a position of the β axis is maintained in the focal plane without use of the member for holding a fulcrum at the said β axis.

Further, in a preferred embodiment of the sample holder according to the present invention, the invention is characterized in that a barrier caused by a member for holding a fulcrum at the said β axis is removed from emission pathways of characteristic X-rays between the sample arranged on the optical axis of the electron beam and the X-ray detector attached to the electron microscope.

Further, in a preferred embodiment of the sample holder according to the present invention, the invention is characterized in that the sample holder has a structure capable for easily mounting and removing only the sample stage because of no use of the member for holding a fulcrum at the β axis.

In order to explain the present invention in more detail, an example of the invention will be concretely shown with reference to the drawings, but the invention is not intended to be interpreted as being limited to the following example.

Figure 3:
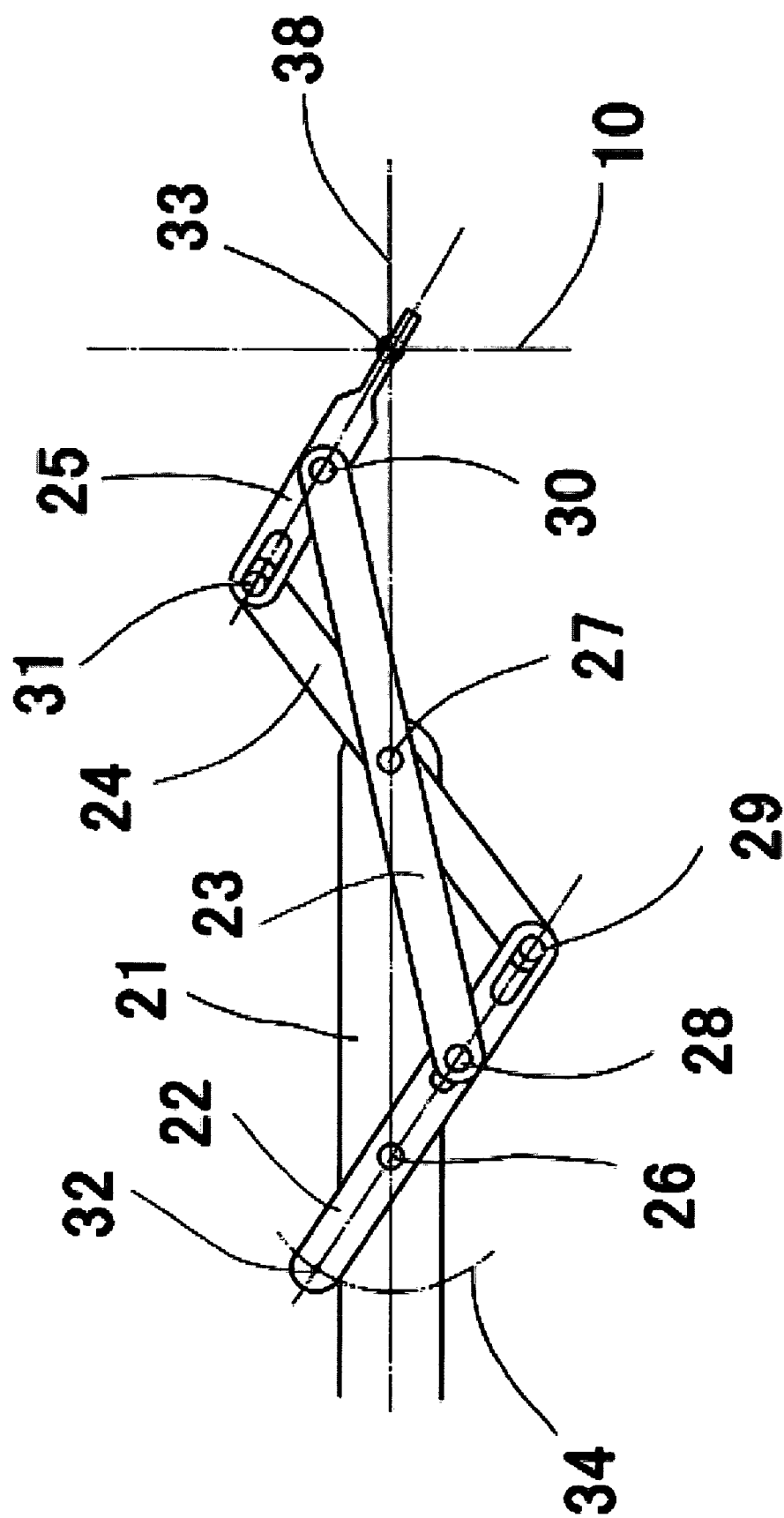
FIG. 3 shows a schematic diagram of the structure of a means for driving β tilt viewed from a direction of the β tilt axis, as an example for the present invention.
Figure 4:
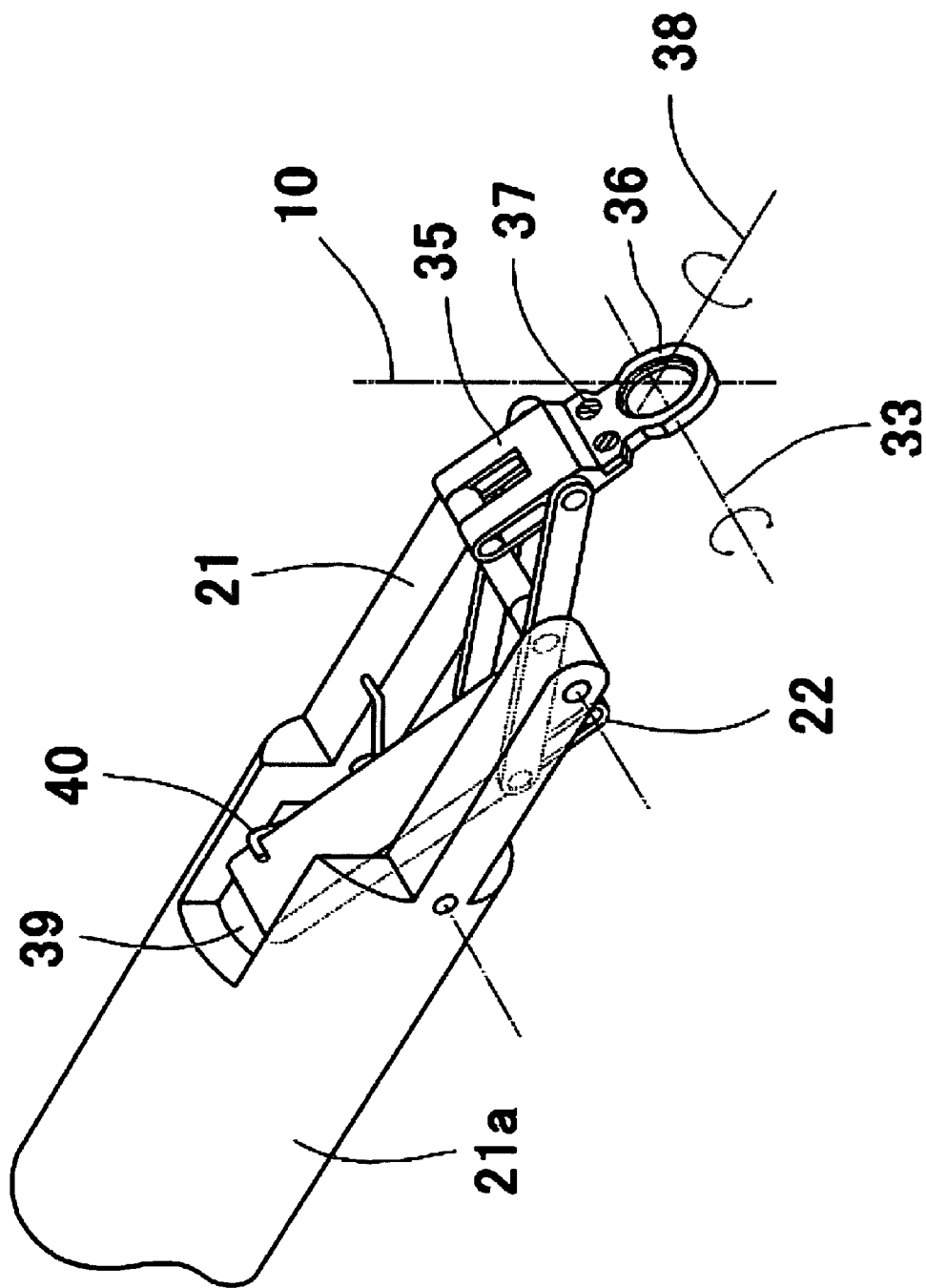
FIG. 4 shows a perspective view of the apical end of the sample holder, as an example for the present invention.

FIGS. 3 and 4 show a mechanism for tilting the sample at the β tilt axis 33. The power of motion is subsequently transferred to the members 23 and 24 having the fulcrum pin 27 fixed to the frame member 21. The driving power point 32 of the member 22 which has the fulcrum pin 26 fixed to the member 21 mounted at the tip of the holder body 21a is rotated in the direction 34. Thereby, the member 25 (including the sample retaining stage) is driven by moving locations of the pins 30 and 31, so that the β tilt axis 33 can be tilted at the height of the sample holder axis 38. Although in this example the β tilt is attained by using the rotation driving mechanism in the direction 34, the present invention is not limited to any specific mechanism as long as it can tilt the sample with no use of the member holding a fulcrum at the β tilt axis in effect by other driving mechanisms.

Moreover, a means for the rotational movement in the direction 34 is also not limited to any specific one. For example, it is possible to execute the rotational movement in the direction 34 by a back-and-forth motion in the direction parallel to the α axis by using a stick-shaped member.

When the member 24 is rotated with an axis i.e. the pin 27 fixed to the frame member 21, the β tilt axis 33 is drifted from the optical axis to the direction parallel to the α axis 38 together with the tilt of the member 25 since the pin 30 mounted to the member 23 changes in location. However, the drift of the β tilt axis 33 is corrected by lateral movement of the sample holder, so that the β tilt 33 at the optical axis 10 can be attained.

In this way, the spatial gap between the upper 13 and lower 14 P-Ps can be used effectively, resulting into the significant increase of the maximum α tilt angle.

As shown in FIG. 4, the member 25 in FIG. 3 is divided into the sample-tilt driving frame arm member 35 and the sample stage member (sample retaining stage) 36, so that only the sample stage member 36 can be removed and exchanged with a member made of a desired material and shape.

Moreover, although a screw 37 is used for connecting the sample driving frame arm member 35 with the sample retaining member 36, the invention is not limited to such components as long as these members can be connected with each other. For example, there may be a tweezers-shaped end of the frame arm member 35 which can nip the sample retaining member 36 and rotate it around the optical axis 10.

Concerning the power of motion for the driving power point 32, the stick-type member 39 with a wedge-shaped end is inserted into an opening set in the sample holder body 21a and moved along the holder axis 38 so that the driving power point 32 can be picked up. On the other hand, when pulling out the member 39, the driving power point 32 is pushed down by the spring 40. As a result, the sample tilt driving frame arm 35 can be driven to both the tilt directions. A means for inputting the driving power and a mechanism of transmitting the input power to the driving power point 32 are not limited to specific ones in the invention.

INDUSTRIAL AVAILABLENESS

Recently, an art for analyzing three-dimensional (3D) microstructures of materials at the nanometer scale using the electron microscope is being developed. Ideally, a tilt series of images taken by tilting the sample up to 180 degrees is needed in order to obtain the precise 3D information. The present invention has an advantage that it is possible to reduce artifacts in reconstructed 3D images caused by missing image information for large tilt angles, because the sample holder according to the invention make it possible to use effectively the spatial gap between the objective lens P-Ps by omitting the fulcrum retaining member and the maximum α tilt angle is notably increased. Furthermore, in the 3D electron microscopy observation, the sample holder according to the invention can drive the β tilt mechanism which is indispensable for setting a diffraction condition for a crystalline sample.

When the characteristic X-ray measurement in a nanometer area is conducted by using the electron microscope, a better X-ray detection efficiency has been desired because the characteristic X-rays detectable from the sample are very minute. In the present invention, the fulcrum retaining member existing at the β tilt axis can be omitted, that is, there is no barrier which interferes with the emission path of X-rays to the X-ray analysis detector, and thereby tilting the sample for avoiding such a barrier is not needed. Therefore, the invention has an effect of improving a freedom of choice of the incidence angle of the electron beam, which is especially effective for a crystalline sample.

When the characteristic X-ray measurement is conducted by using the electron microscope, the present invention make it possible to exchange only the sample stage easily, and therefore, a number of the sample holders fabricated with different materials in the prior art are not needed.

What is claimed is:

1. A sample holder comprising: a holder body, a sample retaining stage, a means capable for tilting a sample around an axis which is arranged in a direction perpendicular to a long side of a holder body (hereinafter called β axis), wherein the means has a mechanism capable for tilting the sample around the β axis with no relation to the existence of a fulcrum retaining member at said β axis.

2. A sample holder according to claim 1, wherein the means may tilt the sample under the condition that a position of the β axis is maintained in a focal plane.

3. A sample holder according to claim 1, wherein the sample stage may be removable from the holder body.

4. A sample holder according to claim 1, wherein the means has a driving frame for tilting the sample around the β axis.

5. A sample holder according to claim 4, wherein the driving frame is attached to the sample stage.

6. A sample holder according to claim 4, wherein the driving frame has at least one fulcrum capable for rotation as an axis and a fulcrum capable for moving itself within the driving frame.

7. A sample holder according to claim 4, wherein the means has a link member attached to the driving frame.

8. A sample holder according to claim 7, wherein the link member has a fulcrum fixed to the holder body and is attached to the driving frame through a fulcrum of the driving frame.

9. A sample holder according to claim 7, wherein there are one or more of the link members.

10. A sample holder according to claim 7, wherein the link member has a fulcrum on a holder axis parallel to the long side of the holder body (hereinafter called α axis).

11. A sample holder according to claim 10, wherein the sample stage may tilt around a desired β axis with a virtual fulcrum existing on the α axis.

12. A sample holder according to claim 10, wherein the holder body has a means capable for tilting the sample around the α axis.

* * * * *